(12) United States Patent
Syring et al.

(10) Patent No.: US 6,765,791 B2
(45) Date of Patent: Jul. 20, 2004

(54) FRONT INPUT/OUTPUT MODULE

(75) Inventors: Harold Syring, Temple, TX (US); Alan Kyle, Temple, TX (US)

(73) Assignees: Wistron Corporation, Taipei Hsien (TW); Acer Incorporated, Taipei Hsien (TW)

( * ) Notice: Subject to any disclaimer, the term of this patent is extended or adjusted under 35 U.S.C. 154(b) by 65 days.

(21) Appl. No.: 10/142,497

(22) Filed: May 10, 2002

(65) Prior Publication Data

US 2003/0210518 A1 Nov. 13, 2003

(51) Int. Cl.[7] .................................................. G06F 1/16
(52) U.S. Cl. ........................ 361/685; 361/683; 361/727; 439/493; 174/35 C
(58) Field of Search ................................. 361/683–686, 361/725, 752, 803; 710/2, 11, 62, 301–306, 110, 116; 439/608, 638, 905, 609, 939; 174/356, 35 R; 375/222, 224; 235/380, 492, 486, 375, 376, 477.01

(56) References Cited

U.S. PATENT DOCUMENTS

| | | | |
|---|---|---|---|
| 4,399,487 A | * | 8/1983 | Neumann .................... 361/727 |
| 5,224,216 A | * | 6/1993 | Gordon et al. .................. 710/2 |
| 5,357,091 A | * | 10/1994 | Ozawa et al. ................ 235/380 |
| 5,676,567 A | * | 10/1997 | Gluskoter et al. ........... 439/638 |
| 6,139,357 A | * | 10/2000 | Shih ............................ 439/493 |
| 6,211,457 B1 | * | 4/2001 | Cama et al. ............... 174/35 C |
| 6,216,184 B1 | * | 4/2001 | Fackenthall et al. ........ 710/301 |
| 6,507,882 B1 | * | 1/2003 | Golka et al. ................ 710/302 |

FOREIGN PATENT DOCUMENTS

JP    02000012151 A  *  1/2000  ........... H01R/13/56

* cited by examiner

Primary Examiner—Michael Datskovsky
(74) Attorney, Agent, or Firm—Ladas & Parry

(57) ABSTRACT

A front input/output module is provided. The front input/output module, as disclosed in this invention, is adapted to a computer, provided with a chassis and a motherboard. The front input/output module comprises a tray, a printed circuit board and at least one interface device. The tray is detachably disposed inside the chassis. The printed circuit board is disposed on the tray and electrically connected with the motherboard. The interface device, having a connector, is disposed on the tray and electrically connected with the printed circuit board. The connector is exposed when the tray is disposed inside the chassis.

16 Claims, 3 Drawing Sheets

FRONT INPUT/OUTPUT MODULE

BACKGROUND OF THE INVENTION

1. Field of the Invention

The invention relates to a front input/output module; in particular, the invention relates to a front input/output module that allows configurability.

2. Description of the Related Art

Computers need to be interconnected to a wide variety of peripheral devices including printers, scanners, monitors, and controllers among others. In order to compete in today's market and introduce new computers to the market as quickly as possible, it is necessary to design a chassis that is capable of housing many different computer configurations without requiring expensive and time-consuming tooling changes to the chassis for each different configuration.

One of the greatest challenges in achieving this goal is that different system motherboards have different connectors that need to be accessed from outside the chassis. For example, one motherboard might have universal serial bus (USB) and speaker connectors, while another might have a network connection and an extra serial port. Providing the appropriate connector cutouts in the chassis for each different motherboard quickly becomes unmanageable, as a tooling change is required for every motherboard that is used and a product-specific back panel or chassis base is required for every different product. Handling multiple chassis is expensive, as it requires the storage and management of many different part numbers. In addition, the flexibility of a manufacturing line is compromised, especially in build-to-order models where many different products are built on one line.

Historically, there have been numerous attempts to accommodate different I/O connector configurations with a single or a few different chassis. For example, a different chassis base can be created that has cutouts specific to each system board. This is expensive, in terms of tooling, administrative, and storage costs. It also creates manufacturing difficulties, as having a chassis for each board would mean having to store a variety of different bases on-line for assemblers to pull from.

Another way to solve the problem is to change the cutouts in the chassis base each time a new product is introduced; however, this solution only works if a manufacture does a hard switch-over from one product to another, because once the manufacturer completes the switch-over, it cannot switch back without retooling the chassis base. This solution is also deficient in that it requires the manufacturer to store and manage many different revisions of parts for repairs and service stock.

Another area of concern in connection with computer chassis is the need to provide the different connectors accessible through the rear wall of the chassis. This method has become less popular, however, since the space around the rear part of the computer is often restricted. Thus, it is very inconvenient to connect peripheral devices to the rear of the computer.

Another solution has been to provide the connectors accessible through the front wall of the chassis. Typically, the front connector is a given configuration and is assembled to the front wall of the chassis with brackets and fasteners. This method does not allow for interface configurability to meet individual needs.

Accordingly, what is needed is a new design that consists of a complete front input/output module assembly pre-configured per customers request.

SUMMARY OF THE INVENTION

In order to address the disadvantages of the aforementioned front input/output module, the invention provides a front input/output module that allows configurability.

Accordingly, the front input/output module of this invention is adapted to a computer with a chassis and a motherboard. The front input/output module comprises a tray, a printed circuit board and at least one interface device. The tray is detachably disposed inside the chassis, and the printed circuit board is disposed on the tray and electrically connected with the motherboard. The interface device, having a connector, is disposed on the tray and electrically connected with the printed circuit board. The connector is exposed when the tray is disposed inside the chassis.

Furthermore, the tray is provided with a release tab, and the chassis is provided with a plate to abut the release tab when the tray is disposed inside the chassis.

In a preferred embodiment, the chassis is provided with a hole to engage with the release tab when the tray is disposed inside the chassis.

Furthermore, the tray is provided with a plurality of spring tabs.

In a preferred embodiment, this invention provides a computer that comprises a chassis, a motherboard and at least one front input/output module. The motherboard is disposed on the chassis, and the front input/output module is detachably disposed inside the chassis.

BRIEF DESCRIPTION OF THE DRAWINGS

The invention is hereinafter described in detail with reference to the accompanying drawings in which.

DETAILED DESCRIPTION OF THE INVENTION

First Embodiment

Figure 1:
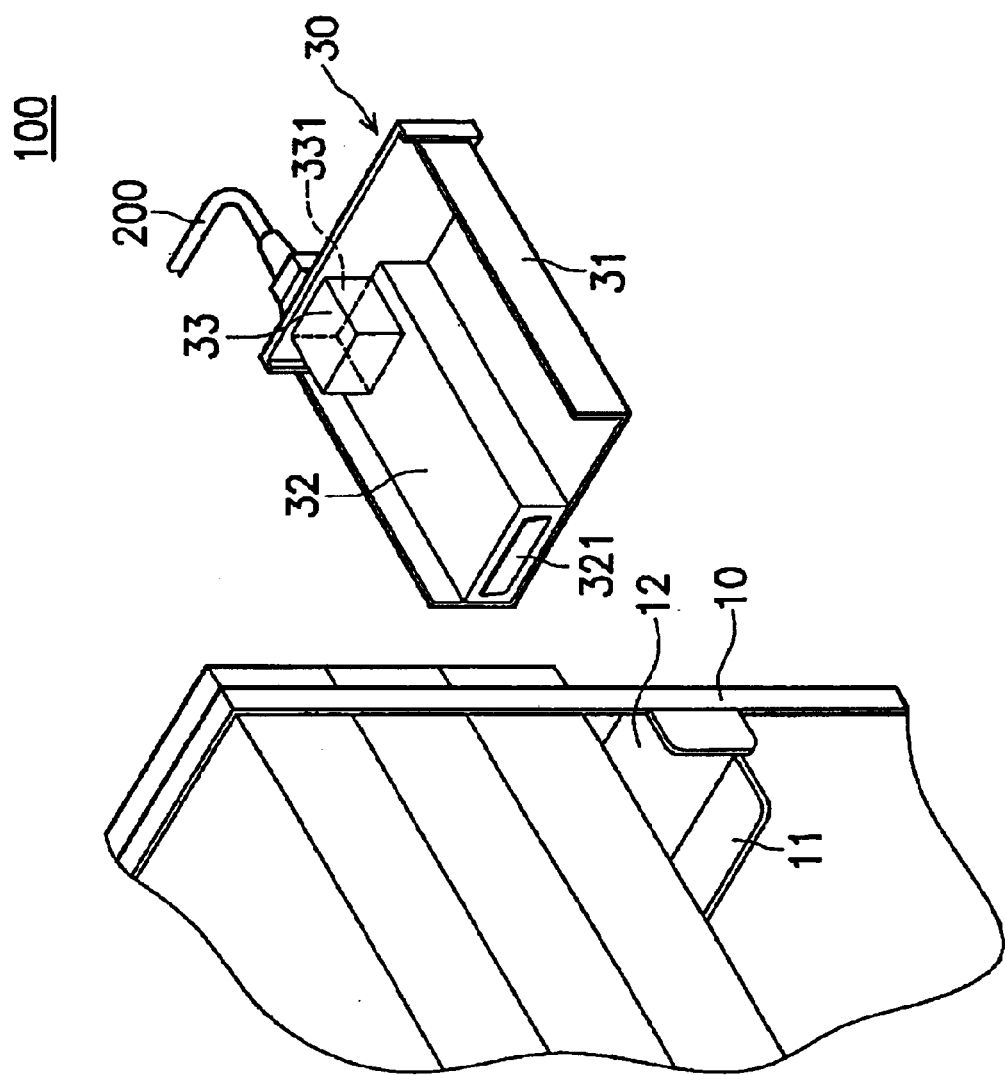
FIG. 1 is a schematic view depicting a computer of a first embodiment of this invention, wherein a front input/output module is separated from a chassis.
Figure 2:
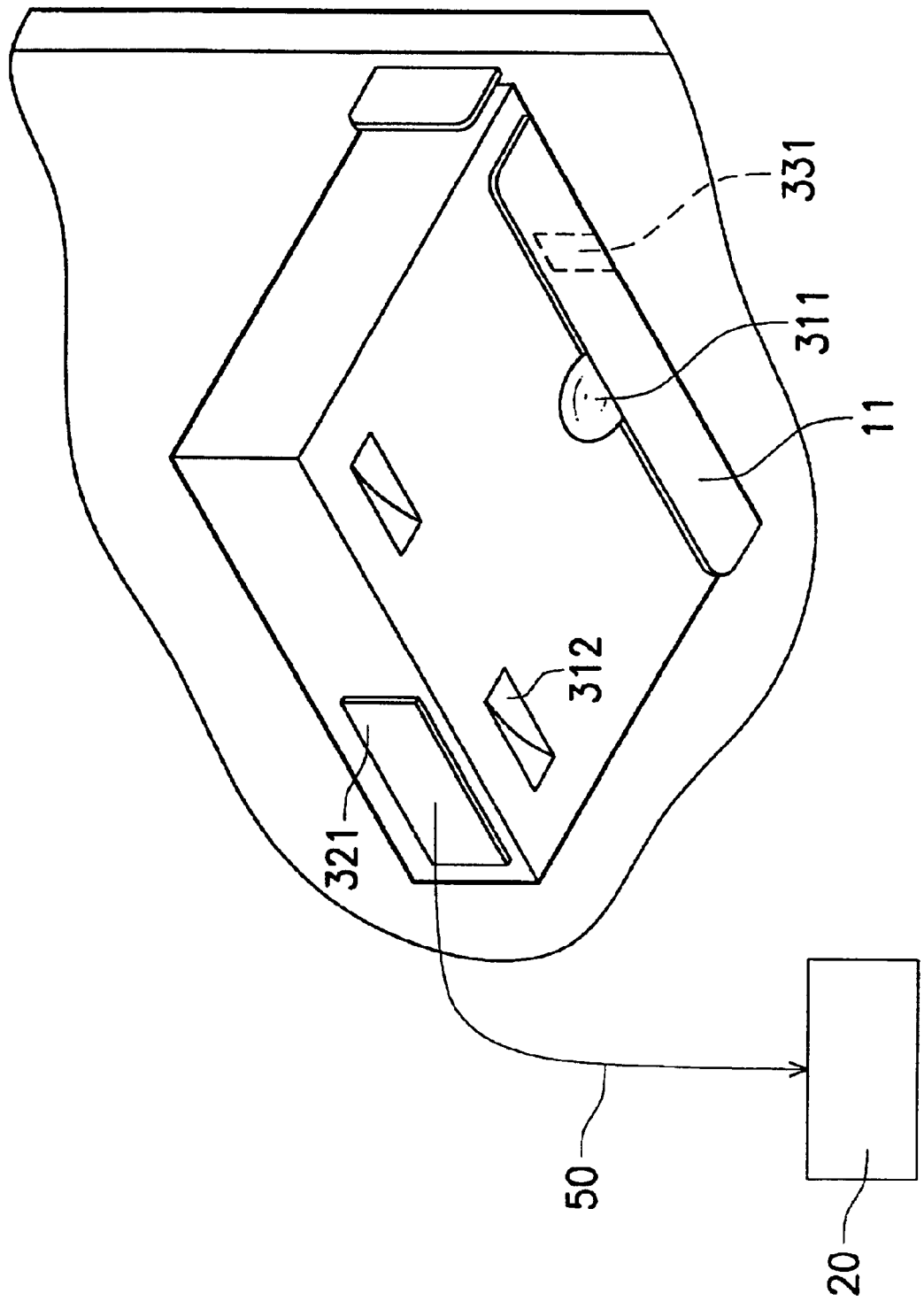
FIG. 2 is a schematic view depicting the computer of the first embodiment of this invention, wherein the front input/output module is inserted into the chassis.

Referring to FIG. 1 and FIG. 2, a computer 100 of this embodiment comprises a chassis 10, a motherboard 20 and a front input/output module 30. In FIG. 1 and FIG. 2, the chassis 10 is provided with a plate 11 and an opening 12 adjacent to the plate 11. The motherboard 20 is disposed on the chassis 10.

The front input/output module 30 is detachably disposed inside the chassis 10, and comprises a tray 31, a printed circuit board 32 and an interface device 33.

The tray 31 is provided with a release tab 311 at its bottom side and a plurality of spring tabs 312. The printed circuit board 32 is disposed on the tray 31, and is provided with a first connector 321 electrically connected with the motherboard 20.

The interface device 33, having a second connector 331, is disposed on the tray 31, and is electrically connected with the printed circuit board 32.

Referring to FIG. 2, when the tray 31 of the front input/output module 30 is disposed inside the chassis 10 through the opening 12, the second connector 331 of the interface device 33 is exposed, and the plate 11 of the chassis 10 abuts the release tab 311 of the tray 31. Also, the first connector 321 of the printed circuit board 32 is electrically connected with motherboard 20 through a wire 50. Thus, the front input/output module 30 is fixedly disposed inside the chassis 10. In addition, since the interface device 33 is electrically connected with the printed circuit board 32 and the printed circuit board 32 is electrically connected with motherboard 20, a peripheral device 200 can electrically connect with motherboard 20 through the interface device 33 by connecting with the second connector 331.

To remove the inserted front input/output module 30 from the chassis 10, the release tab 311 is pressed to disengage with the plate 11 so that the front input/output module 30 can be pushed out of the chassis 10.

It is noted that the number of the front input/output modules 30 and the interface devices 33 is not limited, it depends on the circumstance.

Second Embodiment

Figure 3:
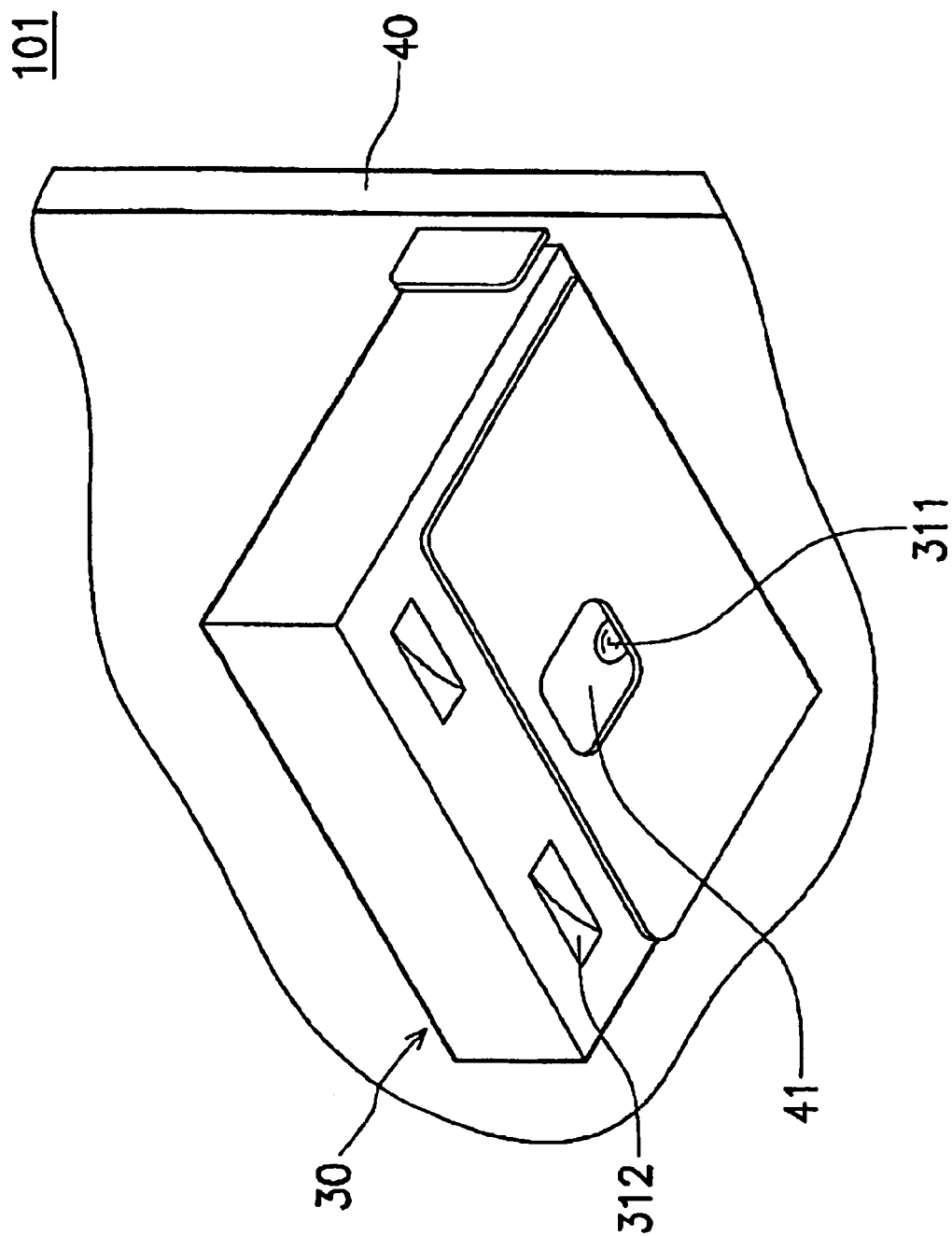
FIG. 3 is a schematic view depicting a computer of a second embodiment of this invention, wherein a front input/output module is inserted into a chassis.

Referring to FIG. 3, a computer 101 of this embodiment comprises a chassis 40, a motherboard 20 (as shown in FIG. 2) and a front input/output module 30. The chassis 40 is provided with a hole 41.

The front input/output module 30 is detachably disposed inside the chassis 40, and comprises a tray 31, a printed circuit board and an interface device (as shown in FIG. 2).

The tray 31 is provided with a release tab 311 at its bottom side and a plurality of spring tabs 312.

Referring to FIG. 3, when the tray 31 of the front input/output module 30 is disposed inside the chassis 40, the release tab 311 of the tray 31 engages with the hole 41 of the chassis 40. Thus, the front input/output module 30 is fixedly disposed inside the chassis 40.

To remove the inserted front input/output module 30 from the chassis 40, the release tab 311 is pressed to disengage with the hole 42 so that the front input/output module 30 can be pushed out of the chassis 40.

Since the tray installs from the front and latches on its lower side, no fasteners are required. Also, the design allows for tolerance variations while maintaining a tight snap fit assembly.

In addition, since the printed circuit board, disposed on the front input/output module, allows for interface options, the design allows configurability.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A front input/output module adapted to a computer, provided with a chassis and a motherboard, comprising:
a tray detachably disposed inside the chassis, wherein the tray is provided with a release tab;
a printed circuit board disposed on the tray and electrically connected with the motherboard; and
at least one interface device, having a connector, disposed on the tray and electrically connected with the printed circuit board, wherein the connector is exposed when the tray is disposed inside the chassis.

2. The front input/output module as claimed in claim 1, wherein the chassis is provided with a plate to abut the release tab when the tray is disposed inside the chassis.

3. The front input/output module as claimed in claim 1, wherein the chassis is provided with a hole to engage with the release tab when the tray is disposed inside the chassis.

4. A front input/output module adapted to a computer, provided with a chassis and a motherboard, comprising:
a tray detachably disposed inside the chassis, wherein the tray is provided with a plurality of spring tabs;
a printed circuit board disposed on the tray and electrically connected with the motherboard; and
at least one interface device, having a connector, disposed on the tray and electrically connected with the printed circuit board, wherein the connector is exposed when the tray is disposed inside the chassis.

5. A computer comprising:
a chassis;
a motherboard disposed on the chassis; and
at least one front input/output module detachably disposed inside the chassis,
wherein the front input/output module comprises:
a tray, wherein the tray is provided with a release tab;
a printed circuit board disposed on the tray and electrically connected with the motherboard; and
at least one interface device, having a connector, disposed on the tray and electrically connected with the printed circuit board, wherein the connector is exposed when the tray is disposed inside the chassis.

6. The computer as claimed in claim 5, wherein the chassis is provided with at least one plate to abut the release tab when the tray is disposed inside the chassis.

7. The computer as claimed in claim 5, wherein the chassis is provided with at least one hole to engage with the release tab when the tray is disposed inside the chassis.

8. A computer comprising:
a chassis;
a motherboard disposed on the chassis; and
at least one front input/output module detachably disposed inside the chassis,
wherein the front input/output module comprises;
a tray, wherein the tray is provided with a plurality of spring tabs;
a printed circuit board disposed on the tray and electrically connected with the motherboard; and
at least one interface device, having a connector, disposed on the tray and electrically connected with the printed circuit board, wherein the connector is exposed when the tray is disposed inside the chassis.

9. A front input/output module adapted to a computer, provided with a chassis and a motherboard, comprising:
a removable tray inside the chassis, wherein the removable tray has a release tab;
a printed circuit board affixed to the removable tray and electrically connected to the motherboard; and
at least one interface device, having a connector, affixed to the removable tray and electrically connected to the printed circuit board, wherein the connector is exposed when the removable tray is inside the chassis.

10. The front input/output module as claimed in claim 9, wherein the chassis has a plate to abut the release tab when the removable tray is inside the chassis.

11. The front input/output module as claimed in claim 9, wherein the chassis has an opening to engage with the release tab when the removable tray is inside the chassis.

12. A front input/output module adapted to a computer, provided with a chassis and a motherboard, comprising:
a removable tray inside the chassis, wherein the removable tray has at least one spring tab;

a printed circuit board affixed to the removable tray and electrically connected to the motherboard; and at least one interface device, having a connector, affixed to the removable tray and electrically connected to the printed circuit board, wherein the connector is exposed when the removable tray is inside the chassis.

13. A computer comprising:

a chassis;

a motherboard affixed to the chassis; and at least one removable front input/output module inside the chassis, wherein the removable front input/output module comprises:
  a tray, wherein the tray has a release tab;
  a printed circuit board affixed to the tray and electrically connected to the motherboard; and
  at least one interface device, having a connector, affixed on the tray and electrically connected to the printed circuit board, wherein the connector is exposed when the tray is disposed inside the chassis.

14. The computer as claimed in claim 13, wherein the chassis is provided with at least one plate to abut the release tab when the tray is inside the chassis.

15. The computer as claimed in claim 13, wherein the chassis is provided with at least one opening to engage with the release tab when the tray is inside the chassis.

16. A computer comprising:

a chassis;

a motherboard affixed to the chassis; and at least one removable front input/output module inside the chassis, wherein the front input/output module comprises:
  a tray, wherein the tray has at least one spring tab;
  a printed circuit board affixed to the tray and electrically connected to the motherboard; and
  at least one interface device, having a connector, affixed to the tray and electrically connected to the printed circuit board, wherein the connector is exposed when the tray is disposed inside the chassis.

* * * * *